United States Patent
Shin

(10) Patent No.: US 7,608,518 B2
(45) Date of Patent: Oct. 27, 2009

(54) SEMICONDUCTOR DEVICE AND METHOD FOR FABRICATING THE SAME

(75) Inventor: Yong Wook Shin, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/951,627

(22) Filed: Dec. 6, 2007

(65) Prior Publication Data

US 2008/0157265 A1 Jul. 3, 2008

(30) Foreign Application Priority Data

Dec. 28, 2006 (KR) .................. 10-2006-0135918

(51) Int. Cl.
*H01L 21/76* (2006.01)
(52) U.S. Cl. .................. 438/425; 438/221; 438/296; 257/E21.54; 257/E21.546; 257/E21.549
(58) Field of Classification Search .............. 438/221, 438/225, 359, 410, 424, 443, 706, 196, 207, 438/248, 294, 296, 404, 425; 257/499, 374, 257/501, E21.54, E21.546, E21.549
See application file for complete search history.

(56) References Cited

U.S. PATENT DOCUMENTS 6,492,696 B2 * 12/2002 Morimoto et al. ........... 257/412
6,825,544 B1 * 11/2004 Jin .............................. 257/499
7,396,729 B2 * 7/2008 Jeong et al. ................. 438/296

* cited by examiner

*Primary Examiner*—Quoc D Hoang
(74) *Attorney, Agent, or Firm*—Finnegan, Henderson, Farabow, Garrett & Dunner, L.L.P.

(57) ABSTRACT

A method for fabricating a semiconductor device is provided. The method includes forming a pad oxide layer on a semiconductor substrate, forming a pad nitride layer on the pad oxide layer, forming a capping layer on the pad nitride layer, patterning the capping layer, the pad nitride layer, and the pad oxide layer by a photolithography method to expose portions of the semiconductor substrate, forming a field oxidation layer having bird's beaks, the bird's beaks being formed under the pad nitride layer, forming trenches in the semiconductor substrate by anisotropically etching the field oxide layer and the semiconductor substrate using the pad nitride layer as a mask, removing the capping layer, the pad nitride layer, the pad oxide layer, and the bird's beaks, and forming an isolation region in the trenches.

4 Claims, 3 Drawing Sheets

SEMICONDUCTOR DEVICE AND METHOD FOR FABRICATING THE SAME

CROSS-REFERENCE TO RELATED APPLICATIONS

This application claims the benefit of priority to Korean patent application no. 10-2006-0135918, filed on Dec. 28, 2006, the entire contents of which are incorporated herewith by reference.

BACKGROUND

1. Technical Field

The present invention relates to a semiconductor device and a method for fabricating the same. More particularly, the present invention relates to a semiconductor device having an isolation layer formed by a shallow trench isolation (STI) method, and a method for fabricating the semiconductor device.

2. Related Art

FIGS. 1A to 1C illustrate a conventional fabrication process of a semiconductor device.

Referring to FIG. 1A, a pad oxide layer 13, a pad nitride layer 15, and a capping layer 17 are sequentially formed on a semiconductor substrate 11. Capping layer 17, pad nitride layer 15, and pad oxide layer 13 are patterned by a photolithography method, thus exposing portions of semiconductor substrate 11.

Referring to FIG. 1B, the exposed portions of semiconductor substrate 11 are dry-etched by using capping layer 17 as an etch mask, thereby forming trenches 19.

Referring to FIG. 1C, insulating material, such as silicon oxide, may be deposited over capping layer 17, so that trenches 19 are gap-filled. Then, the insulating material is polished to expose capping layer 17, thereby forming isolation layers 21 remaining within trenches 19. Capping layer 17, pad nitride layer 15, and pad oxide layer 13 are then removed by wet etch.

However, in the semiconductor device fabricated according to the conventional art, the thickness of a gate insulating layer to be formed later may not be uniform, and may be thin at the edges of isolation layers 21. Thus, a strong electric field may be realized at the edges of isolation layers 21 when the semiconductor device operates. Accordingly, the lifespan of the semiconductor device may be shortened, because the gate insulating layer may easily be degraded and/or broken.

SUMMARY

Embodiments consistent with the present invention provide a semiconductor device and a method for fabricating the same, in which a gate insulating layer having a uniform thickness and not having a thin thickness at the edges of an isolation layer, thereby preventing the lifespan of the semiconductor device from being shortened due to degradation of the gate insulating layer.

In one embodiment, there is provided a method of fabricating a semiconductor device, including forming a pad oxide layer on a semiconductor substrate, forming a pad nitride layer on the pad oxide layer, forming a capping layer on the pad nitride layer, patterning the capping layer, the pad nitride layer, and the pad oxide layer by a photolithography method to expose portions of the semiconductor substrate, forming a field oxidation layer having bird's beaks, the bird's beaks being formed under the pad nitride layer, forming trenches in the semiconductor substrate by anisotropically etching the field oxide layer and the semiconductor substrate using the pad nitride layer as a mask, removing the capping layer, the pad nitride layer, the pad oxide layer, and the bird's beaks, and forming an isolation region in the trenches.

In another embodiment, there is provided a semiconductor device including: a semiconductor substrate having trenches formed therein, the trenches having rounded upper side edges; and an isolation layer gap-filled in the trenches including the rounded upper side edges.

BRIEF DESCRIPTION OF THE DRAWINGS

The above and other features consistent with the present invention will become apparent from the following detailed description given in conjunction with the accompanying drawings, in which.

DETAILED DESCRIPTION

Hereinafter, embodiments consistent with the present invention will be described in detail with reference to the accompanying drawings, so that they can be readily implemented by those skilled in the art.

FIGS. 2A to 2D illustrate a process for fabricating a semiconductor device, in accordance with embodiments consistent with the present invention.

Figure 1A:
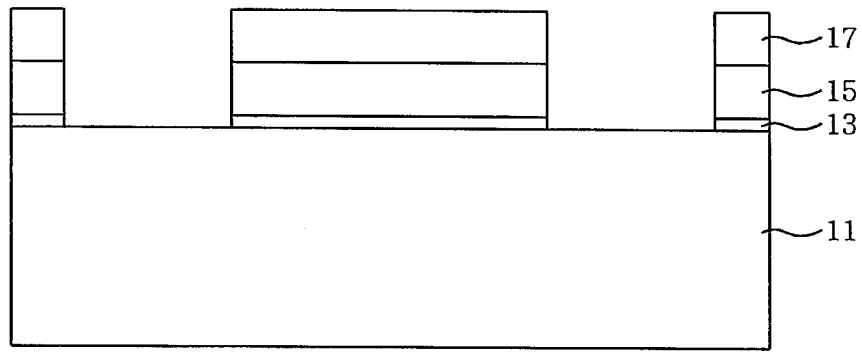
FIGS. 1A to 1C illustrate a conventional fabrication process of a semiconductor device.
Figure 1B:
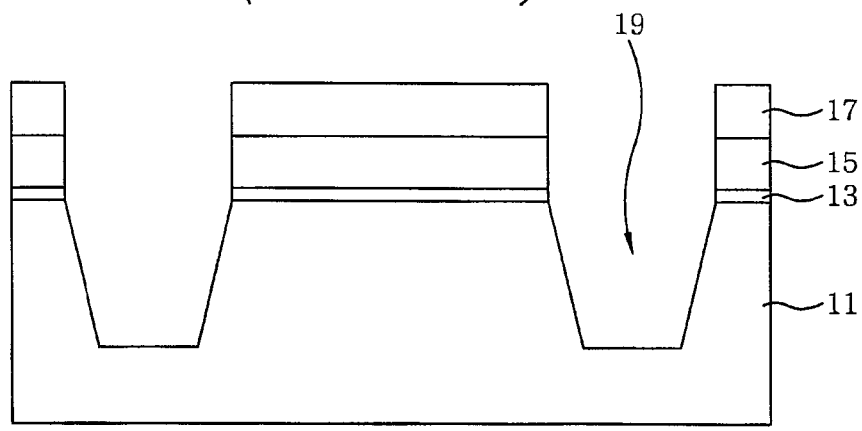
Figure 1C:
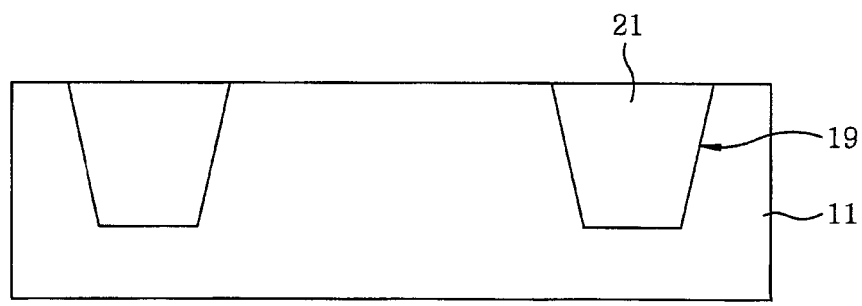
Figure 2A:
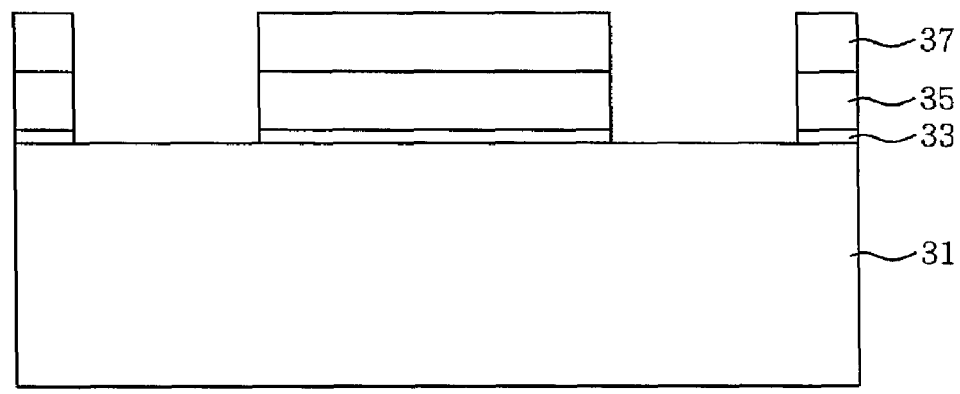
FIGS. 2A to 2D illustrate a process for fabricating a semiconductor device, in accordance with embodiments consistent with the present invention.

Referring to FIG. 2A, a pad oxide layer 33 is formed on a semiconductor substrate 31. Preferably, pad oxide layer 33 has a thickness of approximately 50 Å to approximately 80 Å. A pad nitride layer 35, which may comprise silicon nitride, is formed on pad oxide layer 33. Preferably, pad oxide layer 35 has a thickness of approximately 500 Å to approximately 1500 Å. A capping layer 37, which may comprise tetraethyl orthosilicate (TEOS), is formed on pad nitride layer 35. Preferably, capping layer 37 has a thickness of approximately 500 Å to approximately 1500 Å.

In one embodiment, for example, pad nitride layer 35 and capping layer 37 may be formed by using a chemical vapor deposition (CVD) method. The presence of capping layer 37 may prevent the generation of a polymer so that the top surface of pad nitride layer 35 is not etched when trenches are later formed.

Figure 2B:
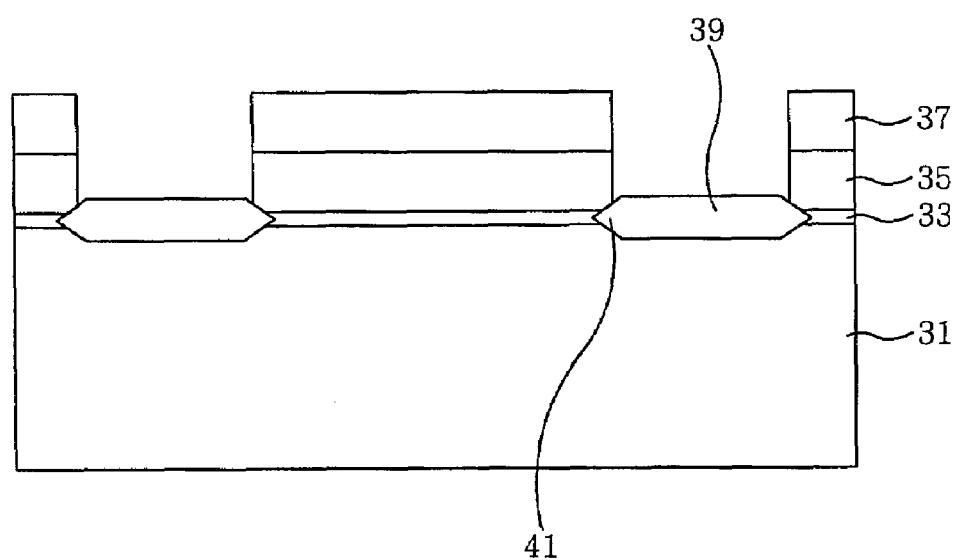

Referring to FIG. 2B, the exposed portions of semiconductor substrate 31 are thermally oxidized by a typical local oxidation of silicon (LOCOS) method, thus forming field oxide layers 39. Preferably, field oxide layers 39 have a thickness of approximately 500 Å to approximately 100 Å. Field oxide layers 39 are preferably formed to penetrate approximately 300 Å to approximately 700 Å into sides of pad oxide layer 33 beneath pad nitride layer 35, so that bird's beaks 41 are formed. Further, the portion of semiconductor substrate 31 under the side edge of pad nitride layer 35 is rounded approximately 300 Å to approximately 700 Å by bird's beak 41.

Figure 2C:
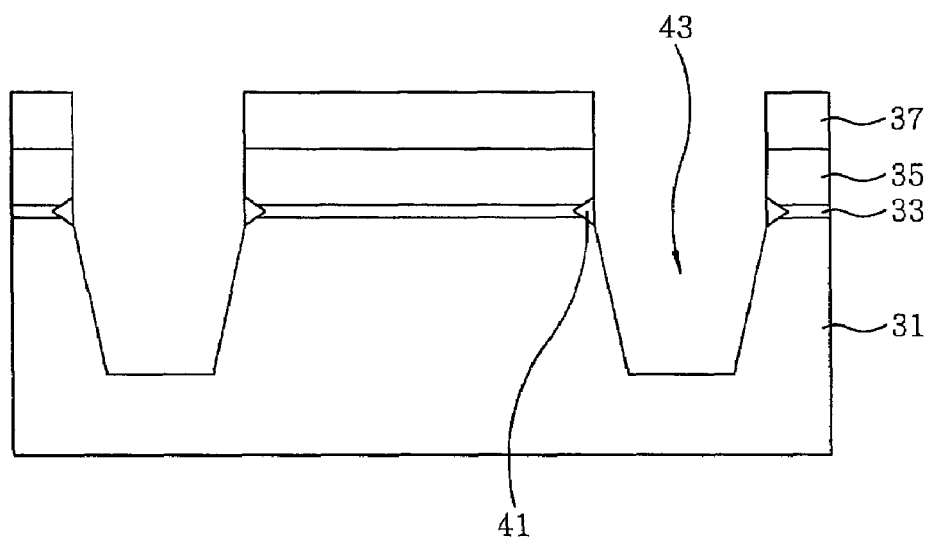

Referring to FIG. 2C, field oxide layer 39 is etched, and semiconductor substrate 31 is then etched to form trenches 43. Preferably, field oxide layer 39 and semiconductor substrate 31 are etched to a depth of approximately 2000 Å to approximately 5000 Å by means of an anisotropic etch method, such as reactive ion etching (RIE), by using capping layer 37 as a mask, thus forming trenches 43. Bird's beaks 41 of field oxide layer 39 formed beneath pad nitride layer 35 are not etched, but remain at the upper side edges of trenches 43. Because capping layer 37 covers pad nitride layer 35 when trenches 43 are formed, no polymer may be generated, thus preventing pad nitride layer 35 from being etched.

Figure 2D:
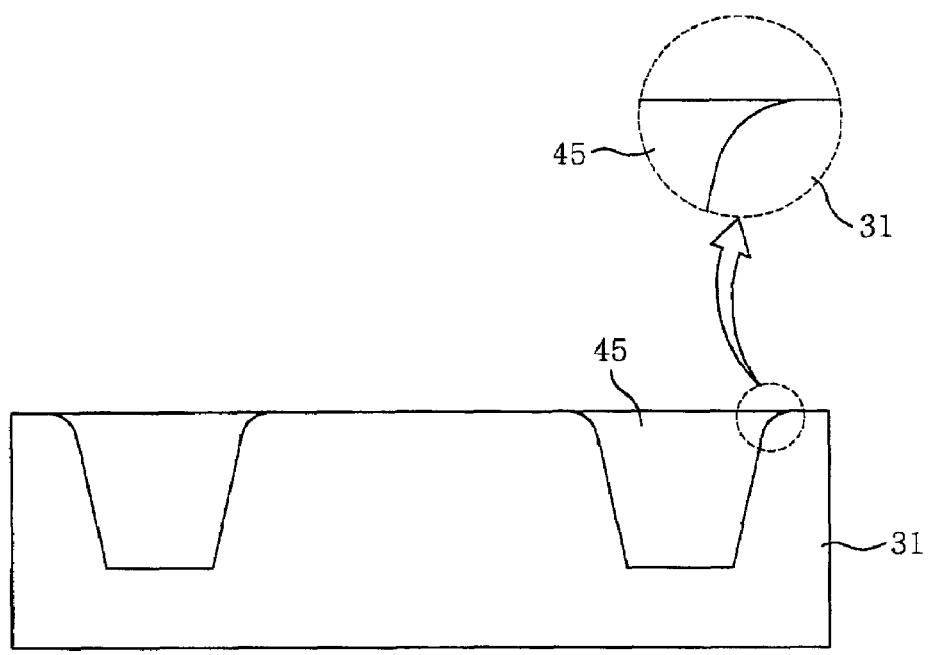

Referring to FIG. 2D, capping layer 37, pad nitride layer 35, and pad oxide layer 33 are removed by a wet etch method. At this time, bird's beaks 41 of field oxide layer 39 remaining at the upper side edges of trenches 43 are also removed. Thus, the upper side edges of trenches 43 of semiconductor substrate 31 are rounded.

Still referring to FIG. 2D, an insulating material, such as silicon oxide, may then be deposited over semiconductor substrate 31 by using a CVD method, thus gap-filling trenches 43. The insulating material may be polished by using a chemical mechanical polishing (CMP) method, so that semiconductor substrate 31 is exposed. Accordingly, insides of trenches 43 are filled with an insulating material to form isolation regions 45, which may separate active regions. In this case, a portion of isolation regions 45 is also formed on the rounded upper side edges of trenches 43.

Accordingly, even if a gate insulating layer (not shown) to be formed later does not have a uniform thickness, and has a thin thickness at the upper side edges of trenches 43, the gate insulating layer will have a sufficient thickness, since the thickness thereof can be compensated by the rounded upper side edges of isolation regions 45. Thus, the gate insulating layer can be prevented from being degraded and/or broken due to strong electric field applied to the edges of isolation layer 45 when the semiconductor device operates, and the lifespan of the semiconductor device can be extended.

As describe above, the exposed portions of the semiconductor substrate are thermally oxidized by a LOCOS method to form field oxide layer 39 having bird's beaks 41 formed under pad nitride layer 35. Field oxide layer 39 and semiconductor substrate 31 may be anisotropically etched by using pad nitride layer 35 as a mask to form trenches 43, while keeping bird's beaks 41 of field oxide layer 39 remaining in pad oxide layer 33. While removing pad nitride layer 35 and pad oxide layer 33, the remaining bird's beaks 41 are also removed, thus making rounding the upper side edges of trenches 43. Isolation regions 45 are formed within trenches 43, so that the upper side edges are gap-filled. TEOS may be deposited on pad nitride layer 35 by using a CVD method, thus forming capping layer 37. Accordingly, the presence of a polymer generated due to the etching of pad nitride layer 37 can be prevented when forming trenches 43.

Accordingly, the gate insulating layer formed at the edges of the isolation layer can be prevented from being degraded and/or broken. Accordingly, the lifespan of the semiconductor device can be extended.

While the present invention has been shown and described with respect to specific embodiments, it will be understood by those skilled in the art that various changes and modifications may be made without departing from the scope consistent with the present invention as defined in the appended claims.

What is claimed is:

1. A method for fabricating a semiconductor device, comprising:

forming a pad oxide layer on a semiconductor substrate;
   forming a pad nitride layer on the pad oxide layer;
   forming a capping layer on the pad nitride layer;
   patterning the capping layer, the pad nitride layer, and the pad oxide layer by a photolithography method to expose portions of the semiconductor substrate;
   forming a field oxidation layer having bird's beaks, the bird's beaks being formed under the pad nitride layer;
   forming trenches in the semiconductor substrate by anisotropically etching the field oxide layer and the semiconductor substrate using the pad nitride layer as a mask;
   removing the capping layer, the pad nitride layer, the pad oxide layer, and the bird's beaks; and
   forming an isolation region in the trenches after removing the pad nitride layer;
   wherein the field oxide layer is formed to penetrate into sides of the pad oxide layer for about 300 Å to about 700 Å beneath the pad nitride layer, thereby forming the bird's beaks.

2. A method for fabricating a semiconductor device, comprising:

forming a pad oxide layer on a semiconductor substrate;
   forming a pad nitride layer on the pad oxide layer;
   forming a capping layer on the pad nitride layer;
   patterning the capping layer, the pad nitride layer, and the pad oxide layer by a photolithography method to expose portions of the semiconductor substrate;
   forming a field oxidation layer having bird's beaks, the bird's beaks being formed under the pad nitride layer;
   forming trenches in the semiconductor substrate by anisotropically etching the field oxide layer and the semiconductor substrate using the pad nitride layer as a mask;
   removing the capping layer, the pad nitride layer, the pad oxide layer, and the bird's beaks; and
   forming an isolation region in the trenches after removing the pad nitride layer;
   wherein upper side edges of the trenches are rounded in a region for about 300 Å to about 700 Å below a surface of the semiconductor substrate, the region corresponding to the bird's beaks.

3. A method for fabricating a semiconductor device, comprising:

forming a pad oxide layer on a semiconductor substrate;
   forming a pad nitride layer on the pad oxide layer;
   forming a capping layer on the pad nitride layer;
   patterning the capping layer, the pad nitride layer, and the pad oxide layer by a photolithography method to expose portions of the semiconductor substrate;
   forming a field oxidation layer having bird's beaks, the bird's beaks being formed under the pad nitride layer;
   forming trenches in the semiconductor substrate by anisotropically etching the field oxide layer and the semiconductor substrate using the pad nitride layer as a mask;
   removing the capping layer, the pad nitride layer, the pad oxide layer, and the bird's beaks; and
   forming an isolation region in the trenches after removing the pad nitride layer, wherein forming the isolation region comprises filling an isolation material in the trenches and on upper side edges of the trenches.

4. A method for fabricating a semiconductor device, comprising:

forming a pad oxide layer on a semiconductor substrate;
   forming a pad nitride layer on the pad oxide layer;
   forming a capping layer on the pad nitride layer;
   patterning the capping layer, the pad nitride layer, and the pad oxide layer by a photolithography method to expose portions of the semiconductor substrate;

forming a field oxidation layer having bird's beaks, the bird's beaks being formed under the pad nitride layer;

forming trenches in the semiconductor substrate by anisotropically etching the field oxide layer and the semiconductor substrate using the pad nitride layer as a mask;

removing the capping layer, the pad nitride layer, the pad oxide layer, and the bird's beaks; and forming an isolation region in the trenches after removing the pad nitride layer;

wherein, when forming the trenches, the bird's beaks of the field oxidation layer are not etched and remain at upper side edges of the trenches, and wherein removing the capping layer, the pad nitride layer, the pad oxide layer, and the bird's beaks includes removing the bird's beaks to round the upper side edges of the trenches.

* * * * *